(12) United States Patent
Bae et al.

(10) Patent No.: US 7,457,120 B2
(45) Date of Patent: Nov. 25, 2008

(54) PLASMA DISPLAY APPARATUS

(75) Inventors: Sung-Won Bae, Suwon-si (KR); Nam-Sung Jung, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 616 days.

(21) Appl. No.: 11/111,714

(22) Filed: Apr. 22, 2005

(65) Prior Publication Data
US 2005/0243106 A1    Nov. 3, 2005

(30) Foreign Application Priority Data
Apr. 29, 2004  (KR) ................ 10-2004-0029933
Apr. 29, 2004  (KR) ................ 10-2004-0029934

(51) Int. Cl.
*H02K 7/20*    (2006.01)
(52) U.S. Cl. ............... 361/704; 361/707; 361/714; 361/719
(58) Field of Classification Search ............ None
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Shinoda et al. | |
| 5,724,054 A | 3/1998 | Shinoda | |
| 5,786,794 A | 7/1998 | Kishi et al. | |
| 5,952,782 A | 9/1999 | Nanto | |
| 5,971,566 A | 10/1999 | Tani et al. | |

(Continued)

FOREIGN PATENT DOCUMENTS

JP    02-148645    6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Boris L Chervinsky
(74) *Attorney, Agent, or Firm*—Robert E. Bushnell, Esq.

(57) ABSTRACT

A plasma display apparatus is capable of enhancing the heat dissipating ability of a plasma display panel, and of reducing the total weight of the plasma display apparatus. The plasma display apparatus comprises a plasma display panel, a frame to which the plasma display panel is attached and by which the plasma display panel is supported, and a boss plate fixed to a rear surface of the frame and fitted with driving circuit boards. The frame is formed in the shape of a rectangular frame which contacts edges of the plasma display panel. A vertical member is vertically disposed in the rectangular frame. The vertical member has wall-mounted bosses which support the total weight of the plasma display apparatus. Other features include a thermally conductive member formed on the rear surface of the frame, and formation of an air passage between the thermally conductive member and the driving circuit boards.

22 Claims, 9 Drawing Sheets

U.S. PATENT DOCUMENTS

| | | | |
|---|---|---|---|
| RE37,444 E | 11/2001 | Kanazawa | |
| 6,373,702 B2 * | 4/2002 | Oishi et al. | 361/704 |
| 6,411,353 B1 * | 6/2002 | Yarita et al. | 349/59 |
| 6,630,916 B1 | 10/2003 | Shinoda | |
| 6,707,436 B2 | 3/2004 | Setoguchi et al. | |
| 6,894,739 B2 * | 5/2005 | Sung et al. | 349/58 |
| 6,946,798 B2 * | 9/2005 | Kawaguchi et al. | 315/85 |
| 7,164,586 B2 * | 1/2007 | Lin | 361/714 |
| 2004/0036819 A1 * | 2/2004 | Ryu et al. | 349/58 |
| 2005/0047067 A1 * | 3/2005 | Bang et al. | 361/681 |

FOREIGN PATENT DOCUMENTS

| | | |
|---|---|---|
| JP | 10240138 A * | 9/1998 |
| JP | 2845183 | 10/1998 |
| JP | 2917279 | 4/1999 |
| JP | 11-284936 | 10/1999 |
| JP | 11-296094 | 10/1999 |
| JP | 11-305675 | 11/1999 |
| JP | 11-338370 | 12/1999 |
| JP | 2000-089682 | 3/2000 |
| JP | 2000-181373 | 6/2000 |
| JP | 2001-022280 | 1/2001 |
| JP | 2001-022281 | 1/2001 |
| JP | 2001-043804 | 2/2001 |
| JP | 2001-325888 | 11/2001 |
| JP | 2002-116710 | 4/2002 |
| JP | 2002-123178 | 4/2002 |
| JP | 2003-043944 | 2/2003 |
| JP | 2004094091 A * | 3/2004 |
| KR | 10-2001-0103251 | 11/2001 |
| KR | 10-2003-0012694 | 2/2003 |
| KR | 2003-0094494 | 12/2003 |
| KR | 2004-0024411 | 3/2004 |

* cited by examiner

PLASMA DISPLAY APPARATUS

CLAIM OF PRIORITY

This application makes reference to, incorporates the same herein, and claims all benefits accruing under 35 U.S.C. 119 from two applications for PLASMA DISPLAY APPARATUS both of which were earlier filed in the Korean Intellectual Property Office on 29 Apr. 2004 and, there duly assigned Serial Nos. 10-2004-0029933 and 10-2004-0029934, respectively.

BACKGROUND OF THE INVENTION

1. Technical Field

The present invention relates to a plasma display apparatus and, more particularly, to a plasma display apparatus in which a plasma display panel (PDP) is supported by a thermally conductive member, a frame, and a boss plate.

2. Related Art

As is known well, a plasma display apparatus comprises a plasma display panel for generating plasma through gas discharge and for displaying images using the plasma, a chassis base supporting the plasma display panel, and driving circuit boards which are provided at the side of the chassis base opposite to the plasma display panel, and which are connected to display electrodes and address electrodes drawn out from the plasma display panel through flexible printed circuits and connectors.

Since the plasma display panel is composed of two sheets of glass substrates, the plasma display panel has a weak mechanical rigidity. As a result, a metallic chassis base having a mechanical rigidity greater than that of the glass is used to keep the plasma display panel stable with respect to mechanical rigidity.

The chassis base performs the function of supporting the driving circuit boards, the function of sinking heat from the plasma display panel, and the function of intercepting electromagnetic interference (hereinafter, referred to as EMI), as well as the function of maintaining the rigidity of the plasma display panel described above.

The plasma display panel is fitted to the front surface of the chassis base, and the driving circuit boards are fitted to the rear surface of the chassis base, so as to allow the chassis base to have the above-mentioned functions.

Since the plasma display panel is made of glass, it is difficult to form screw holes in the plasma display panel for the purpose of screw coupling to the chassis base, so that a double-sided tape is used to fit the plasma display panel to the chassis base. Bosses are formed on the rear surface of the chassis base, and the driving circuit boards are fitted to the bosses with screws.

A technique for fitting the plasma display panel onto the front surface of the chassis base is disclosed in U.S. Pat. No. 5,971,566 to Tani et al., entitled PLASMA DISPLAY DEVICE AND ITS MANUFACTURING METHOD, issued on Oct. 26, 1999, in which a thermally conductive member is interposed between the plasma display panel and the chassis base, heat emitted from the plasma display panel is transferred to the chassis base, and the chassis base discharges the heat.

In addition to the heat dissipating function, the chassis base performs a holding function for supporting the plasma display panel and the driving circuit boards. As a result, the chassis base should have a mechanical rigidity which is strongly resistant to sag or twist so as to satisfactorily perform the holding function while compensating for the rigidity of the plasma display panel.

The chassis base can effectively perform heat dissipation of the plasma display panel and compensation for the rigidity of the plasma display panel because the chassis base is made of metal having excellent thermal conductivity, but it has a problem in that the total weight of the plasma display apparatus is increased Since the chassis base supports the plasma display panel on the front surface thereof and the driving circuit boards on the rear surfaces thereof, the chassis base also has a problem in that the entire shape should be changed when positions of the bosses to be fitted with the driving circuit boards are changed or the size of the plasma display panel is changed.

SUMMARY OF THE INVENTION

The present invention relates to a plasma display apparatus which is capable of enhancing the heat dissipating ability of a plasma display panel while reducing the total weight of the plasma display apparatus.

In addition, the present invention relates to a plasma display apparatus which is capable of effectively coping with a change in the size of a plasma display panel or a change in the positions of bosses to be fitted with driving circuit boards by separating a structure for supporting the plasma display panel and a structure for supporting the driving circuit boards.

According to an aspect of the present invention, there is provided a plasma display apparatus comprising: a plasma display panel; a frame attached to a rear surface of the plasma display panel; and a boss plate fixed to a rear surface of the frame and fitted with driving circuit boards which are disposed in parallel with the plasma display panel.

A thermally conductive member may be formed on the rear surface of the plasma display panel.

The thermally conductive member may be formed as a heat spreading sheet, and may be made of one or more of an acrylic heat-dissipating material, a graphite heat-dissipating material, a metal heat-dissipating material, and a carbon nanotube heat-dissipating material.

The thermally conductive member may be made of a solid-state heat-dissipating material or a heat dissipating material which is hardened from a liquid state with the lapse of time. The thermal conductivity of the thermal conductive member preferably ranges from 0.5 to 1000 W/mK so as to smoothly drive the plasma display panel.

The frame may be made of metal so as to compensate for the rigidity of the plasma display panel and so as to bear the entire weight of the plasma display apparatus. The frame may be a rectangular frame such that the frame can be attached to only the edges of the plasma display panel. The frame may include a vertical member provided vertically in the rectangular frame, and the vertical member may be provided with wall-mounted bosses capable of bearing the entire weight of the plasma display apparatus.

The boss plate may be made of a material having a weight smaller than that of the frame, and may be made of a conductive synthetic resin or a metal plate.

The boss plate may be formed in a lattice shape with a frame member, a vertical member, and a horizontal member. The frame member, the vertical member, and the horizontal member may be provided with a plurality of bosses, and the frame member may be further provided with a rib which is formed on the inside of the frame member toward the plasma display panel, and which is inserted into the frame. The bosses may have a height ranging from 5 mm to 15 mm.

An air passage may be formed between the thermally conductive member and the driving circuit boards.

According to another aspect of the present invention, there is provided a plasma display apparatus comprising: a plasma display panel; a frame to which the plasma display panel is attached and by which the plasma display panel is supported; and a boss plate fixed to the rear surface of the frame and fitted with driving circuit boards. The boss plate fixes and supports the driving circuit boards at a side opposing the plasma display panel.

The boss plate may have a plurality of bosses for fitting the driving circuit boards, and may be formed in a plate shape or in a shape obtained by bending a plate. The boss plate may have manipulation holes for manipulating variable elements fitted to the driving circuit boards. The driving circuit boards may have elements fitted thereto and directed toward the plasma display panel. The gap between the elements and the plasma display panel may range from 5 mm to 20 mm. The driving circuit boards may have variable elements fitted thereto and directed toward the boss plate.

An air layer for convection and radiation may be formed between the driving circuit boards and the plasma display panel.

As described above, in the plasma display apparatus according to the present invention, the frame and the boss plate are separated, the frame is made of metal to support the plasma display panel which is provided with a thermally conductive member, the boss plate is made of a material having a weight less than that of the frame, and is fitted with the driving circuit boards, and the air passage is formed between the thermally conductive member and the driving circuit boards. As a result, the heat dissipating performance of the plasma display panel is enhanced, and the entire weight of the plasma display apparatus is lessened, thereby easily coping with change in size of the plasma display panel and change in positions of the bosses for fitting the driving circuit boards.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments of the present invention will be described in detail with reference to the accompanying drawings.

Figure 1:
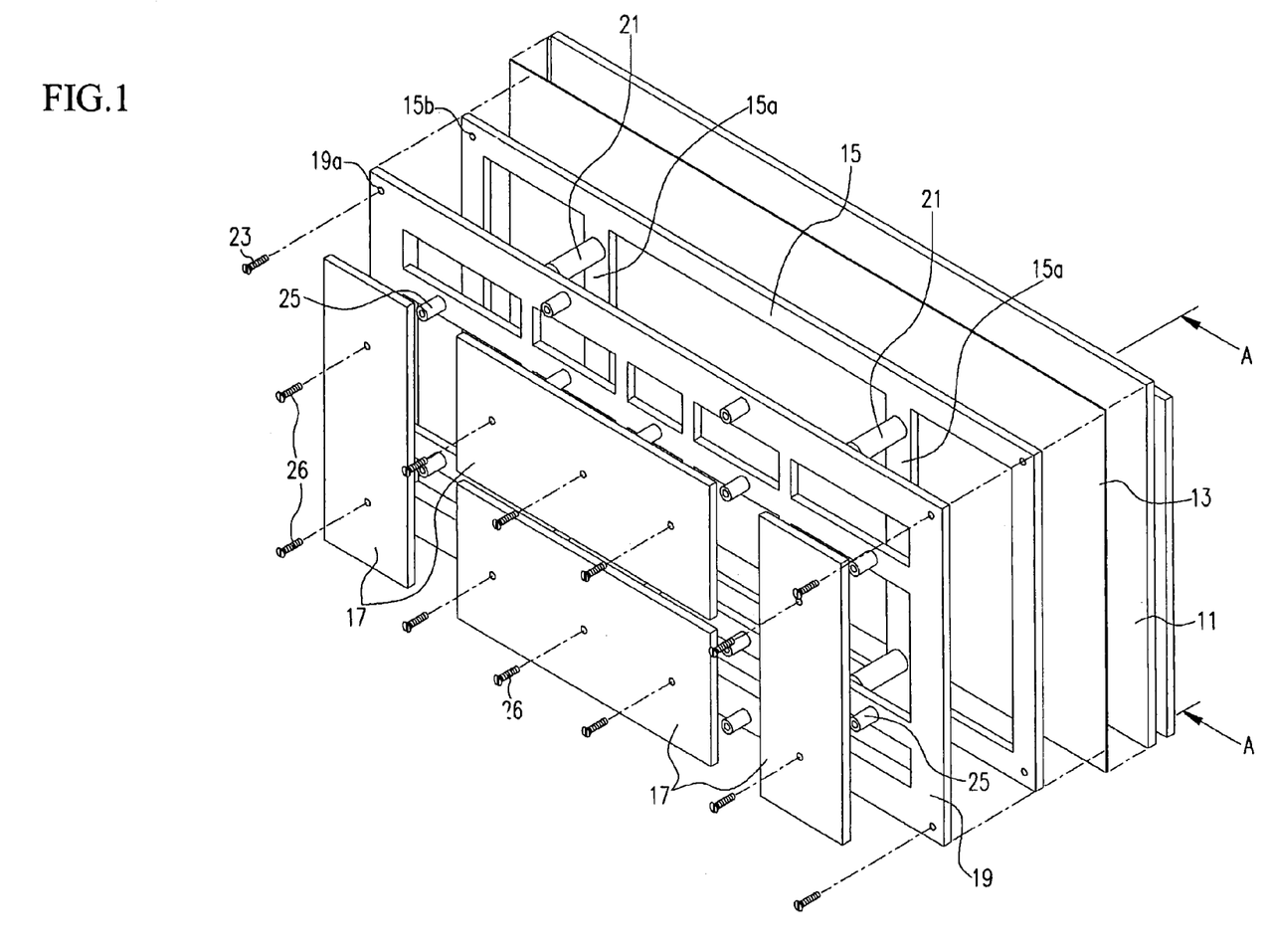
FIG. 1 is an exploded perspective view schematically illustrating a plasma display apparatus according to a first embodiment of the present invention.

FIG. 1 is an exploded perspective view schematically illustrating a plasma display apparatus according to a first embodiment of the present invention.

Referring to FIG. 1, the plasma display apparatus comprises a plasma display panel 11 for displaying images using gas discharge, a thermally conductive member 13 which is provided on the rear surface of the plasma display panel 11, and which dissipates heat generated by the plasma display panel 11, a frame 15 supporting the plasma display panel 11, and a boss plate 19 which is fixed to the rear surface of the frame 15, and to which driving circuit boards 17 are fitted and by which driving circuit boards 17 are supported.

Since the plasma display panel 11 has a construction for displaying images using gas discharge, and since the present invention is directed toward a coupling structure between the plasma display panel 11 and other constituent elements, specific description of the plasma display panel 11 will be omitted.

The thermally conductive member 13 dissipates heat generated by the gas discharge in the plasma display panel 11, and it is provided on the rear surface of the plasma display panel 11. The thermally conductive member 13 is formed as a heat spreading sheet as shown in FIG. 1, and it is attached to the rear surface of the plasma display panel 11. The thermally conductive member 13 may be made of various materials. For example, it may be made of an acrylic heat-dissipating material, a graphite heat-dissipating material, a metal heat-dissipating material, or a carbon nanotube heat-dissipating material. Since it is an important function of the thermally conductive member 13 that horizontal heat conduction in the plasma display panel 11 be smoothly carried out, two or more materials may be applied to a single plasma display panel 11 only if such a function can be carried out.

The thermally conductive member 13 may be made of a solid-state heat dissipating material constituting the heat spreading sheet, and may be made of a heat dissipating material which is hardened from a liquid state with the lapse of time. The heat dissipating material which is hardened into a solid state from a liquid state has merit due to processing of a liquid state. That is, there is merit in that the particular process of forming the thermally conductive member 13 is made unnecessary by forming the thermally conductive member 13 on the plasma display panel 11 using a coating process.

Figure 2:
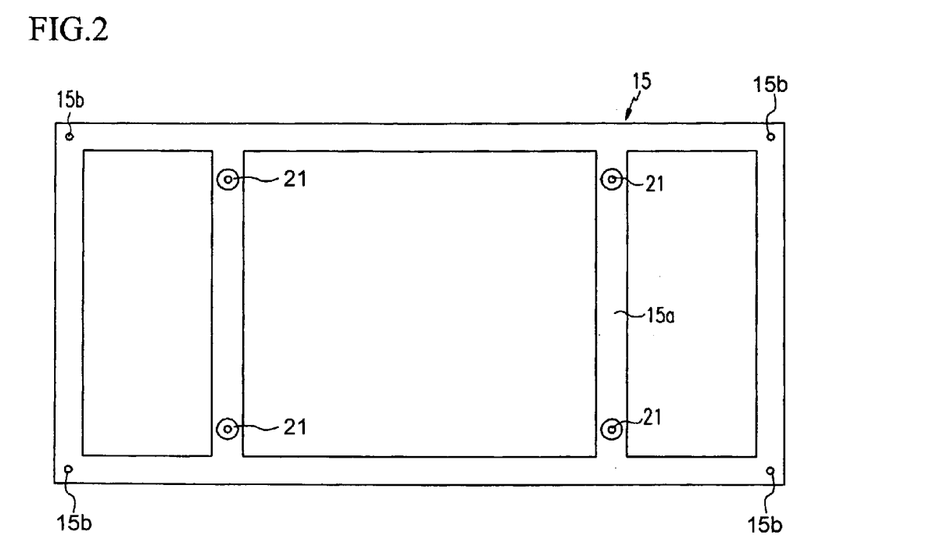
FIG. 2 is a diagram of the rear surface of a frame of the plasma display apparatus according to the first embodiment of the present invention.

FIG. 2 is a diagram of the rear surface of the frame of the plasma display apparatus according to the first embodiment of the present invention.

Referring to FIG. 2, the frame 15 is attached to the rear surface of the plasma display panel 11, and is made of a material capable of compensating for the rigidity of the plasma display panel 11 and of bearing the total weight of the plasma display apparatus, including the plasma display panel 11. In addition, the frame 15 is formed in a structure capable of reducing the total weight of the plasma display apparatus. The frame 15 may be attached directly to the rear surface of the plasma display panel 11, or it may be attached to the thermally conductive member 13, as shown in FIG. 1.

The frame 15 is made of metal having a rigidity larger than that of the plasma display panel 11, which is made of glass, thereby compensating for the rigidity of the plasma display panel 11. In addition, the frame 15 is formed in a rectangular shape for supporting only the edges of the rear surface of the plasma display panel 11, thereby reducing its weight. The rectangular frame shape of the frame 15 is an example of a shape obtained by removing portions except for the minimum portions required for supporting the plasma display panel 11 so as to form a structure capable of bearing the total weight of the apparatus, including the plasma display panel 11, within a range which does not cause structural defects. In other words, a plurality of bar-shaped members is formed integrally with the frame 15. Therefore, the frame 15 may be variously changed in shape so as to be able to reduce the total weight of the plasma display apparatus while supporting the plasma display panel 11. That is, one or more corners of the frame may be formed in a plate shape. The frame 15 further comprises vertical members 15a, as shown in FIG. 1 and FIG. 2. Wall-mounted bosses 21 are formed in the vertical members 15a. The wall-mounted bosses 21 have a rigidity capable of delivering the total weight of the plasma display apparatus from the frame 15 to the wall on which the plasma display apparatus is mounted.

Figure 3:
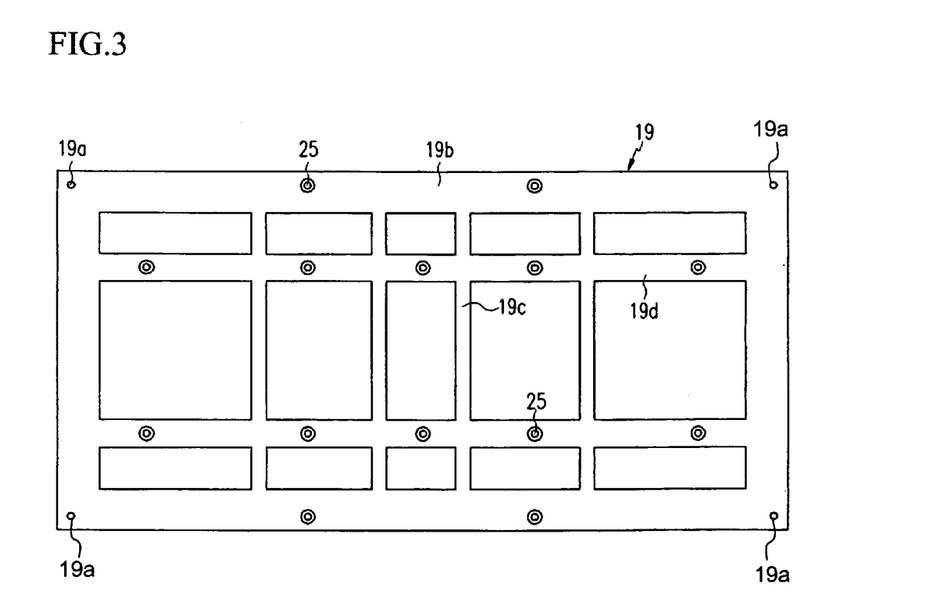
FIG. 3 is a diagram of the rear surface of a boss plate of the plasma display apparatus according to the first embodiment of the present invention.

FIG. 3 is a diagram of the rear surface of the boss plate of the plasma display apparatus according to the first embodiment of the present invention.

Referring to the FIG. 3, the boss plate 19 has coupling holes 19a which can be coupled directly to the coupling holes 15b of the frame 15, that is, which can form a coupling structure with screws 23 (FIG. 1). The coupling holes 19a and the coupling holes 15b are provided at positions of the boss plate 19 and the frame 15, respectively, corresponding to each other. Such a coupling structure makes the boss plate 19 and the frame 15 stably coupled to each other, thereby enhancing reliability of the coupling.

On the other hand, since the frame 15 supports the plasma display panel 11 and bears the total weight of the plasma display apparatus, including the plasma display panel 11, the boss plate 19 need not have a specific rigidity, but must have sufficient rigidity to support the driving circuit boards 17 fitted thereto. Therefore, it is preferable that the boss plate 19 be made of a material having a weight less than that of the frame 15, and it is also preferable that the boss plate 19 be made of a conductive synthetic resin or a metal plate with an EMI shielding function. Since the boss plate 19 is made of a material having a weight less than that of the frame 15, the total weight of the plasma display apparatus can be remarkably reduced while the boss plate 19 supports the driving circuit boards 17.

In addition, the boss plate 19 may have a plate shape, or may be formed in a lattice shape having a frame member 19b, as well as vertical members 19c and horizontal members 19d provided in the frame member 19b, so as to accomplish a decrease in the weight of the plasma display apparatus. In a manner similar to the frame 15, the boss plate 19 is provided to fit the driving circuit boards 17 thereto with decreased weight and has the frame member 19b, the vertical members 19c, and the horizontal members 19d, each of which is provided with bosses 25. However, the boss plate 19 is not limited to the above-mentioned shape. That is, the boss plate 19 can be variously changed in shape to fit the driving circuit boards 17 thereto. The driving circuit boards 17 can be fitted to the bosses 25 of the boss plate 19 with screws 26.

Figure 4:
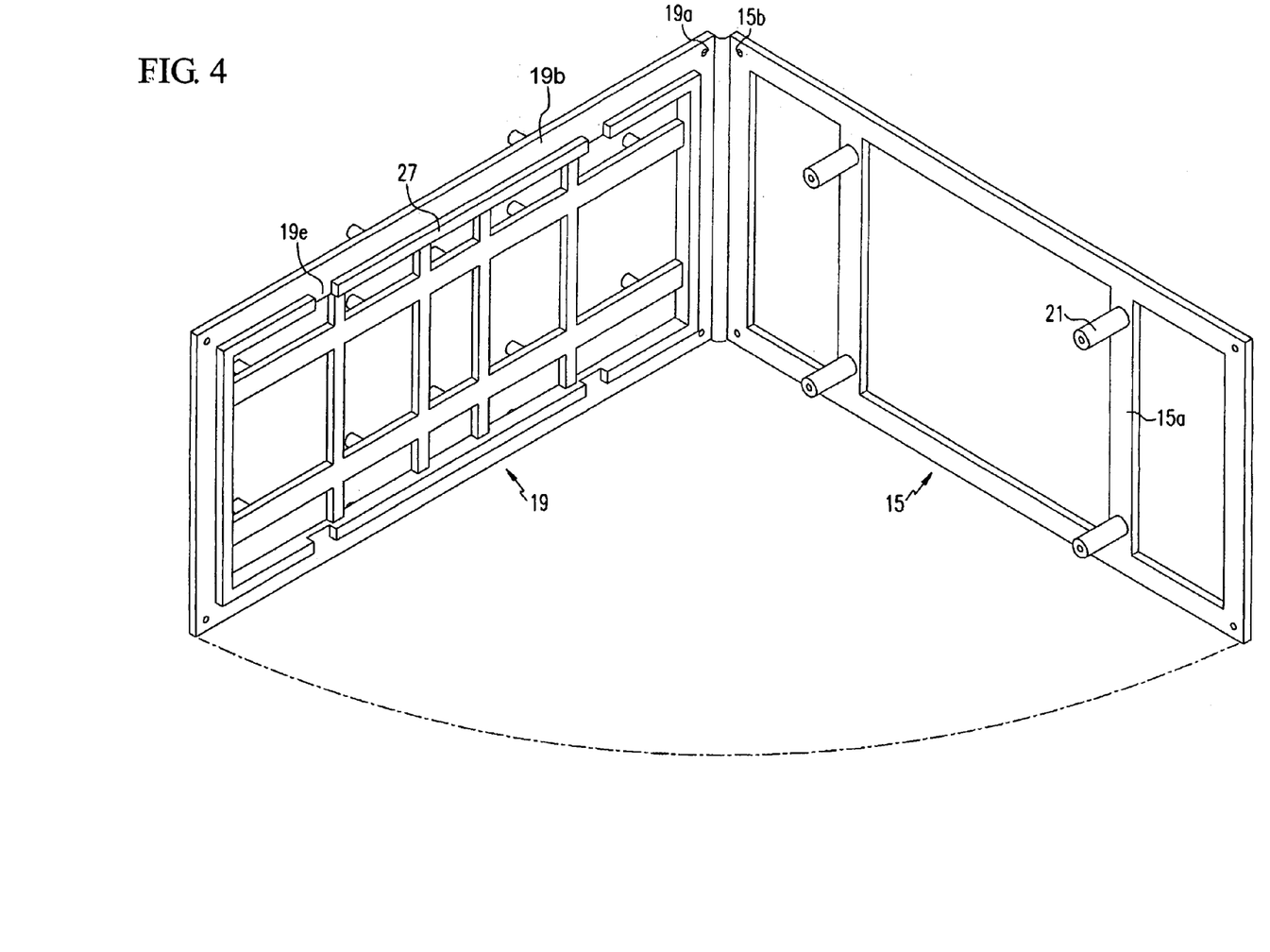
FIG. 4 is an exploded perspective view illustrating the frame and the boss plate of the plasma display apparatus according to the first embodiment of the present invention.

FIG. 4 is an exploded perspective view illustrating the frame and the boss plate of the plasma display apparatus according to the first embodiment of the present invention.

As shown in FIG. 4, the boss plate 19 further comprises a rib 27 which protrudes from the inside of the frame member 19b toward the plasma display panel 11, thereby more firmly coupling the boss plate 19 to the frame 15. The rib 27 may be formed continuously or intermittently (not shown). When the rib 27 is formed continuously, the rib 27 preferably has grooves 19e into which the vertical members 15a of the frame are inserted. The rib 27 couples the boss plate 19 to the frame 15 so as to form a firmer structure.

In a structure in which the frame 15 and the boss plate 19 are separately provided and are coupled to each other, only the frame 15 is changed when the size of the plasma display panel 11 attached to the frame 15 is changed, and only the boss plate 19 is changed when the driving circuit boards 17 are changed, thereby enhancing the degree of freedom in design. Since such a coupling structure can couple the boss plate 19 fitted with the driving circuit boards 17 to the frame 15, the number of processes in manufacturing can be reduced, thereby enhancing productivity.

Figure 5:
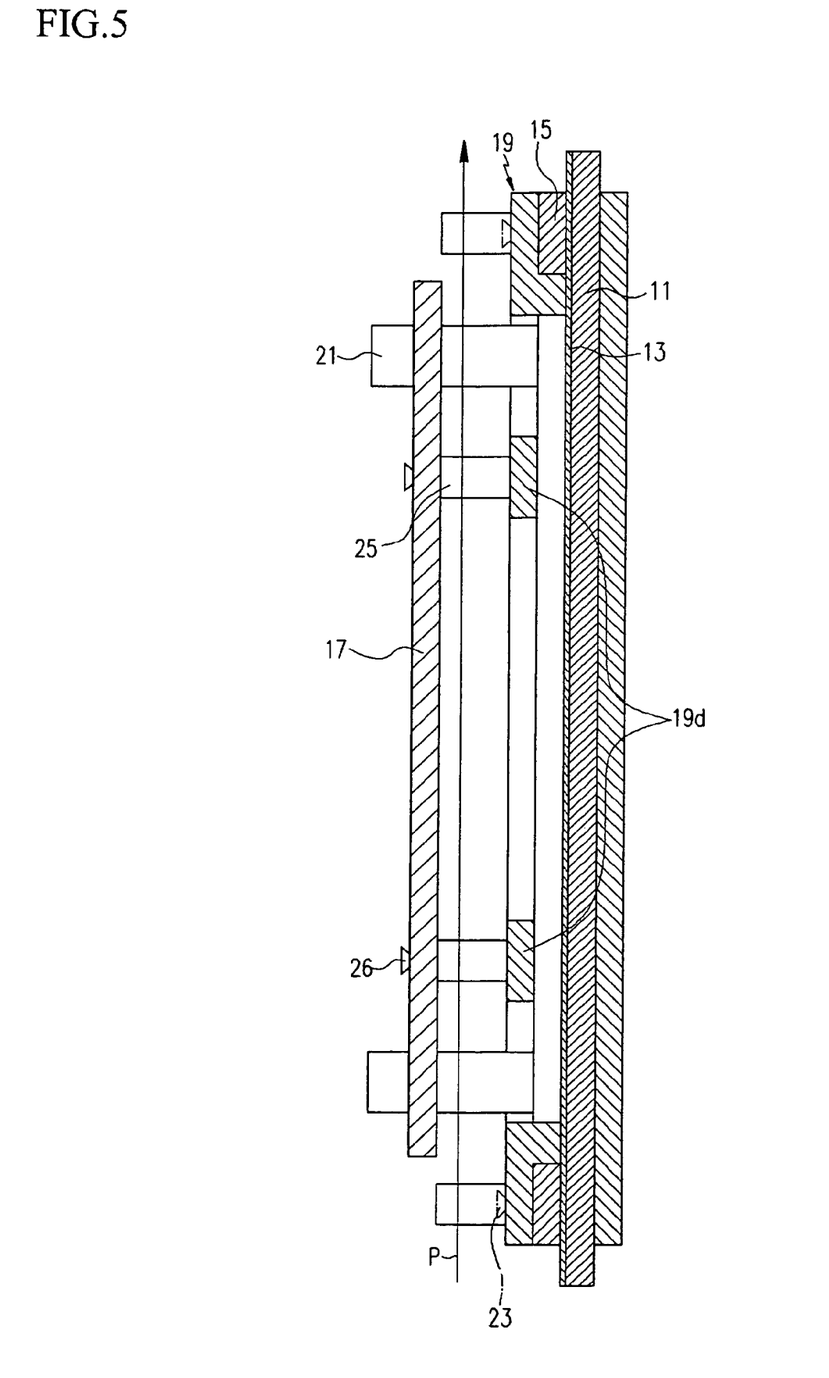
FIG. 5 is a cross-sectional view taken along line A-A of FIG. 1 in a state in which the plasma display apparatus is assembled.

FIG. 5 is a cross-sectional view taken along line A-A of FIG. 1 in a state in which the plasma display apparatus is assembled.

Referring to FIG. 5, it is preferable that the plurality of bosses 25 formed on the boss plate 19 have a height ranging from 5 mm to 15 mm. When the height is less than 5 mm, the air flow between the thermally conductive member 13 and the driving circuit boards 17 is suppressed. When the height is more than 15 mm, the convection is insufficient due to weakening of the air flow, thereby deteriorating the heat dissipating performance.

The height of the bosses 25 contributes to forming an air passage P between the thermally conductive member 13 and the driving circuit boards 17, thereby smoothing the air flow between both so as to induce a natural convection phenomenon, and thus maximizing the heat dissipating efficiency of the plasma display panel 11 and the driving circuit boards 17.

That is, the thermally conductive member 13 is positioned on one side of the air passage P and the driving circuit boards 17 are positioned on the other side thereof. Therefore, the plasma display panel 11 and the driving circuit boards 17 effectively release heat by means of the convection occurring in the air passage P.

Figure 6:
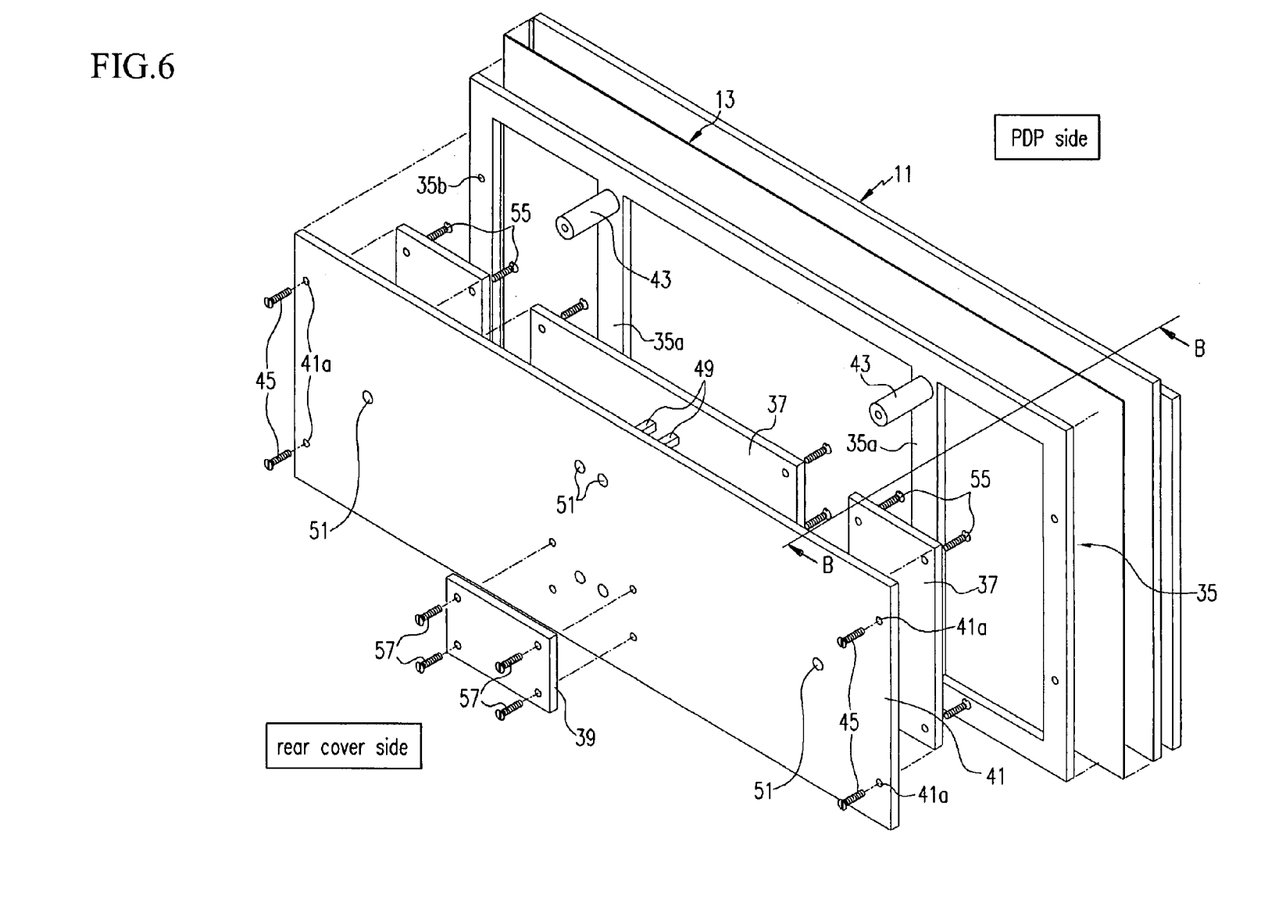
FIG. 6 is an exploded perspective view schematically illustrating a plasma display apparatus according to a second embodiment of the present invention.

FIG. 6 is an exploded perspective view schematically illustrating a plasma display apparatus according to a second embodiment of the present invention.

Referring to FIG. 6, the plasma display apparatus comprises a plasma display panel 11 for displaying images using gas discharge, a thermally conductive member 13 which is formed on the rear surface of the plasma display panel 11, and which dissipates heat generated from the plasma display panel 11, a frame 35 to which the plasma display panel 11 is fitted and by which the plasma display panel 11 is supported, and a boss plate 41 which is fixed to the rear side of the frame 35, and which supports driving circuit boards 37 and set circuit boards 39 fitted thereto.

Figure 7:
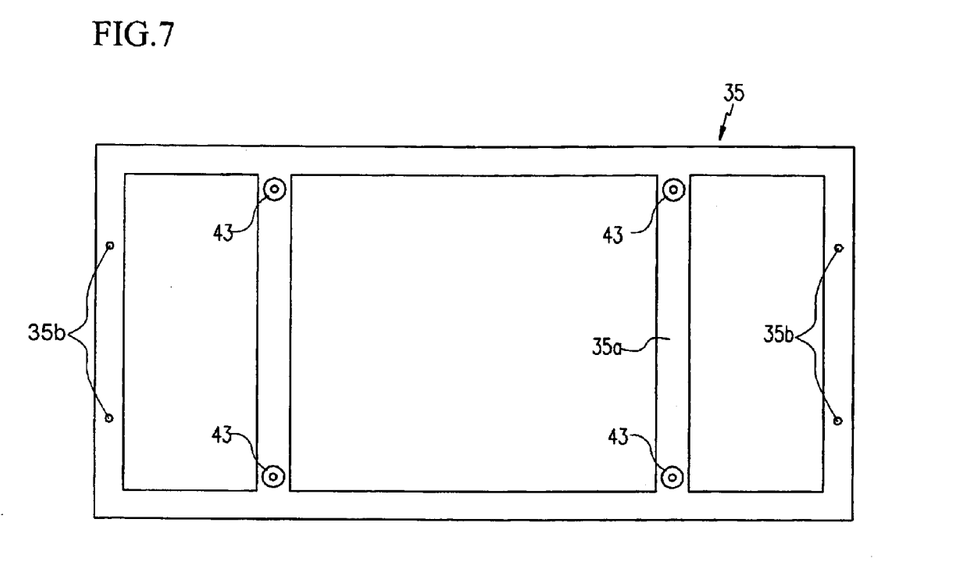
FIG. 7 is a diagram of the rear surface of a frame of the plasma display apparatus according to the second embodiment of the present invention.

FIG. 7 is a diagram of the rear side of the frame of the plasma display apparatus according to the second embodiment of the present invention.

Referring to FIG. 7, the frame 35 is attached to the rear surface of the plasma display panel 11, and is made of a material capable of bearing the total weight of the apparatus, including the plasma display panel 11 while compensating for the rigidity of the plasma display panel 11. In addition, the frame 35 has a structure capable of reducing the total weight of the plasma display apparatus. The frame 35 may be fitted to the thermally conductive member 13, as shown in the FIG. 6, or it may be fitted directly to the rear surface of the plasma display panel 11 (not shown).

The frame 35 is made of metal having a rigidity greater than that of the plasma display panel 11, which is made of glass, thereby compensating for the rigidity of the plasma display panel 11. The frame 35 is formed in a rectangular shape for supporting only the edges of the rear surface of the plasma display panel 11, thereby reducing the weight of the apparatus. The rectangular frame shape of the frame 35 is an example of a shape obtained by removing portions, except for the minimum portions required for supporting the plasma display panel 11, from a structure capable of bearing the total weight of the apparatus including the plasma display panel 11, within a range not causing structural defects. In other words, a plurality of bar-shaped members is formed integrally with the frame 35. Therefore, the frame 35 may be variously changed in shape so as to be able to reduce the total weight of the plasma display apparatus while supporting the plasma display panel 11. That is, one or more corners of the frame 35 may be formed in a plate shape. The frame 35 further comprises vertical members 35a, as shown in FIG. 7. Wall-mounted bosses 43 are formed in the vertical members 35a. The wall-mounted bosses 43 have a rigidity capable of delivering the total weight of the plasma display apparatus from the frame 35 to the wall on which the plasma display apparatus is mounted.

Figure 8:
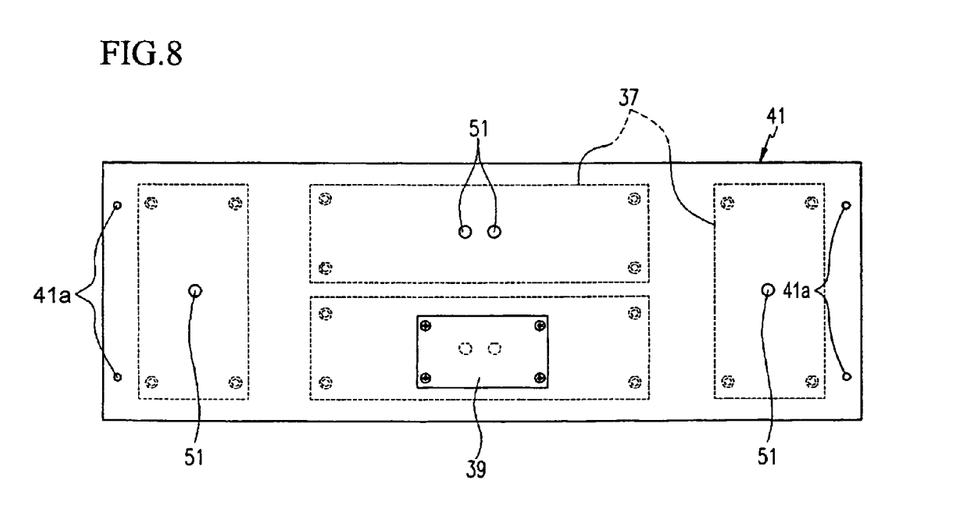
FIG. 8 is a diagram of the rear surface of a boss plate of the plasma display apparatus according to the second embodiment of the present invention.
Figure 9:
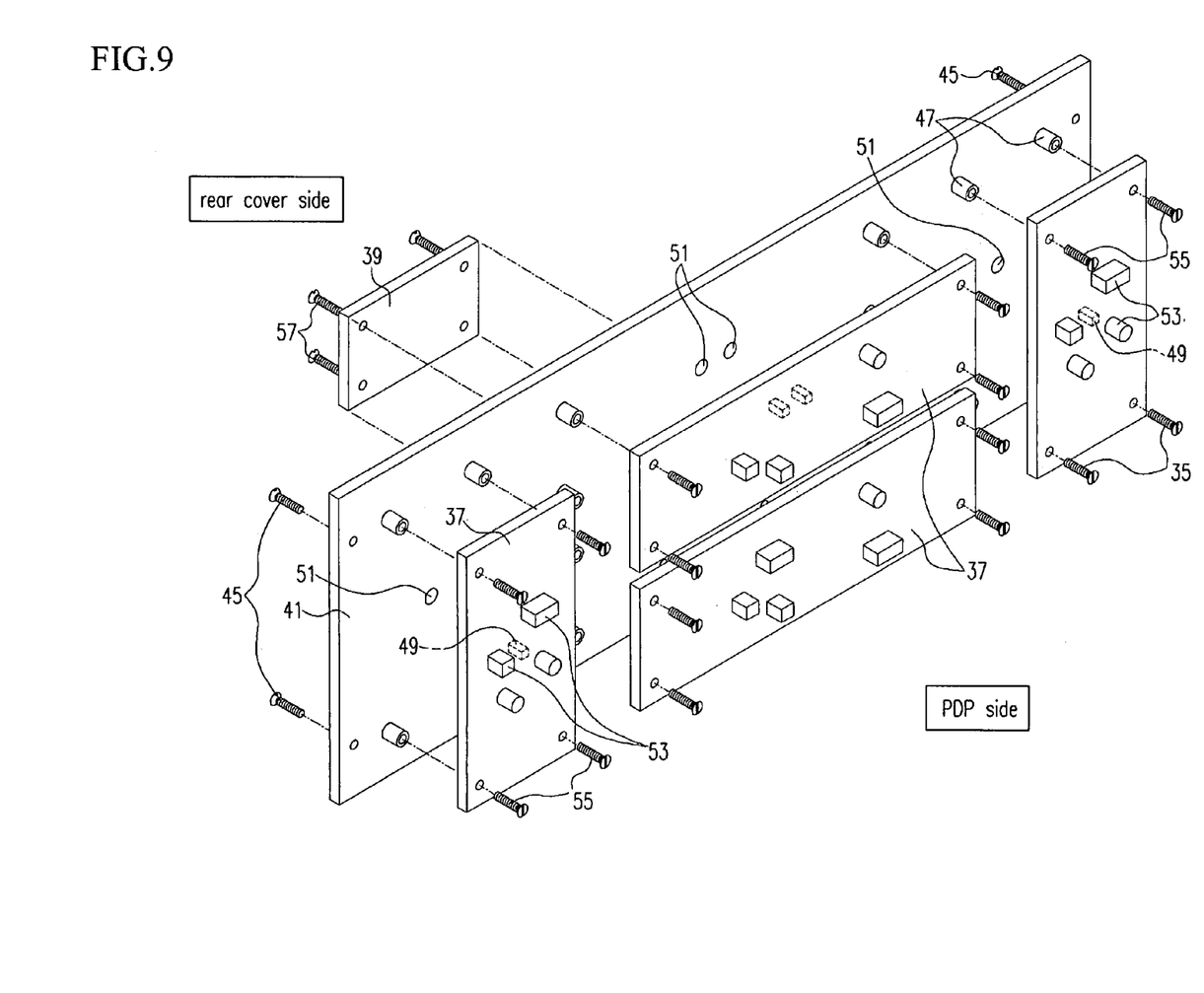
FIG. 9 is an exploded perspective view schematically illustrating coupling of driving circuit boards to the boss plate in FIG. 6.

FIG. 8 is a diagram of the rear surface of the boss plate of the plasma display apparatus according to the second embodiment of the present invention, and FIG. 9 is an exploded perspective view schematically illustrating coupling of the driving circuit boards to the boss plate in FIG. 6.

Referring to FIG. 8 and FIG. 9, the boss plate 41 has coupling holes 41a which can be coupled directly to the coupling holes 35b of the frame 35, that is, which can form a coupling structure with screws 45 (see FIG. 6). The coupling holes 41a and the coupling holes 35b are provided at positions of the boss plate 41 and the frame 35, respectively, corresponding to each other. Such a coupling structure makes the boss plate 41 and the frame 35 stably coupled to each other, thereby enhancing reliability of the coupling.

On the other hand, since the frame 35 supports the plasma display panel 11 and bears the total weight of the plasma display apparatus, including the plasma display panel 11, the boss plate 41 need not have a specific rigidity but must have sufficient rigidity to support the driving circuit boards 37 and the set circuit boards 39 fitted thereto. Therefore, it is preferable that the boss plate 41 be made of a material having a weight less than that of the frame 35, and it is also preferable that the boss plate 41b made of a conductive synthetic resin or a metal plate with an EMI shielding function. Since the boss plate 41 is made of a material having a weight less than that of the frame 35, the total weight of the plasma display apparatus can be remarkably reduced while the boss plate 41 supports the driving circuit boards 37 and the set circuit boards 39.

Figure 11:
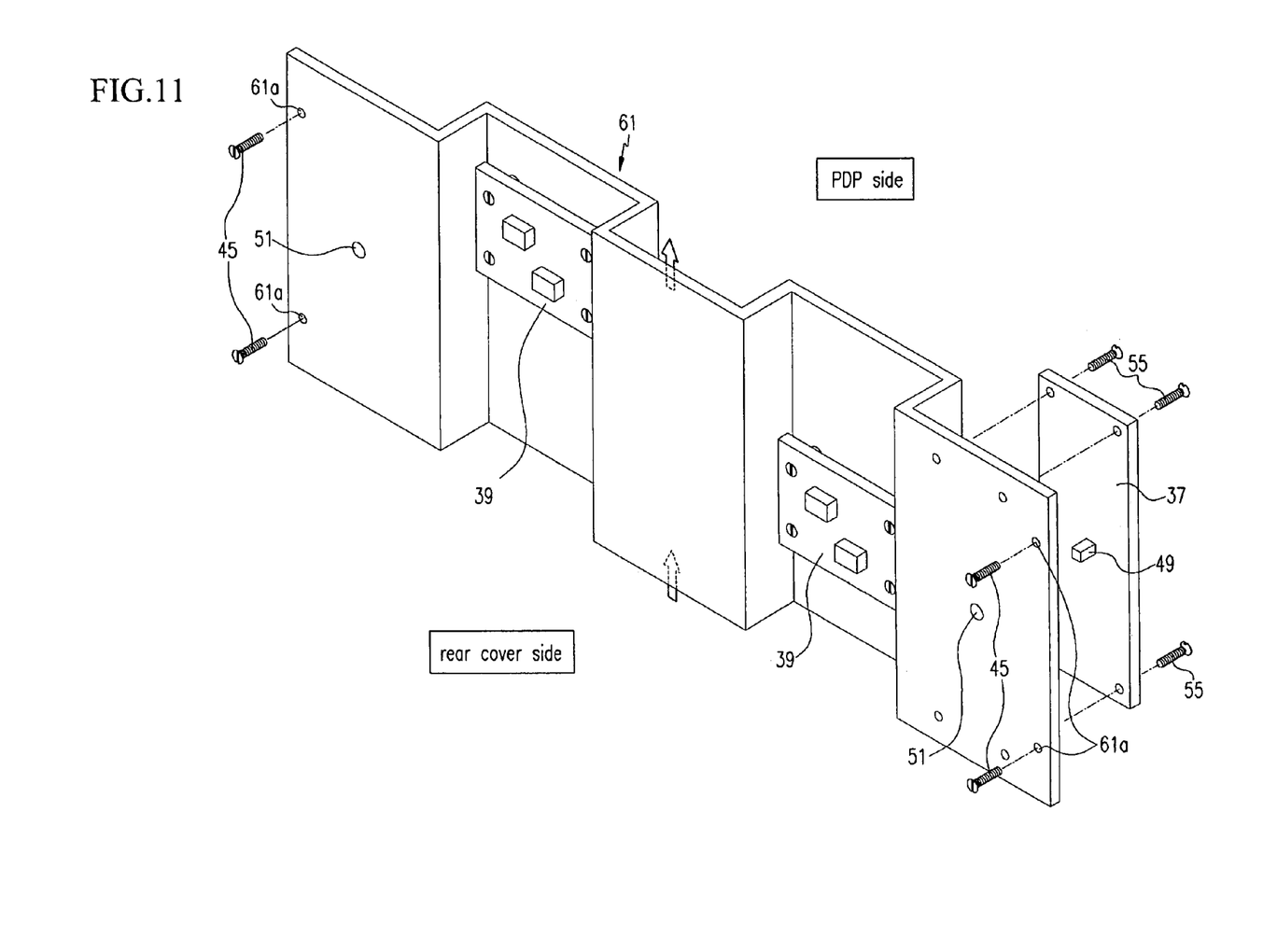
FIG. 11 is a perspective view of a boss plate of a plasma display apparatus according to a third embodiment of the present invention.

In addition, the boss plate 41 may have a plate shape and may have a plurality of bosses 47 (see FIG. 9) for fitting the driving circuit boards 37. Alternatively, a boss plate 61 having a shape obtained by bending the plate shape, as shown in FIG. 11, may be provided. The boss plate 41 may be formed in a lattice shape in which a plurality of bar-shaped members are connected for the purpose of decreasing the weight of the entire plasma display apparatus, or the boss plate 41 may be changed in shape.

Unlike the case in which the boss plate has a lattice shape, the boss plate 41 having a plate shape or the boss plate 61 having a shape obtained by bending a plate shape has manipulation holes 51 for manipulating variable elements 49 provided on the driving circuit boards 37. That is, it is preferable that the manipulation holes 51 be formed to correspond to the variable elements 49. The variable elements 49 are elements for tuning the state of the plasma display panel 11 after electrically connecting the driving circuit boards 37 to the plasma display panel 11, and generally include variable resistors. However, the variable elements 49 are not limited to variable resistors.

The driving circuit boards 37 have a plurality of elements 53 (see FIG. 9) and may include various circuit boards required for driving the plasma display panel 11, such as a board for driving the electrodes of the plasma display panel 11, a switching mode power supply (SMPS) board, etc. The driving circuit boards 37 are manufactured by module makers for the plasma display panel 11. Specifically, the driving circuit boards 37 are fitted to the bosses 47 provided in the boss plate 41 with screws 55 such that the elements 53 oppose the plasma display panel 11. The set circuit boards 39 are fitted with screws 57 onto the surface of the boss plate 41 opposite to the driving circuit boards 37. The set circuit boards 39 include an image board for providing image signals to the completed plasma display panel 11, a power source board for controlling and supplying power, etc., and are manufactured by set makers. In this way, by fitting the driving circuit boards 37 and the set circuit boards 39 onto both surfaces of the boss plate 41, it is possible to effectively prevent physical interference between both circuit boards, and to enhance the degree of freedom in design of the set makers.

Therefore, under mass production, the set makers manufacture various set circuit boards 39, and provide the set circuit boards 39 in a state in which the set circuit boards 39 are fitted to the boss plate 41. The module makers of the plasma display panel 11 manufacture and fit the driving circuit boards 37 to the boss plate 41. Accordingly, the number of processes for assembling the boss plate 41 to the frame 35 can be remarkably reduced.

On the other hand, a buffer board (not shown) is disposed using a well-known method, and serves as an interface between the plasma display panel 11 and the driving circuit boards 37. That is, lines required for the buffer board are connected while assembling the boss plate 41 in the manufacturing process.

Figure 10:
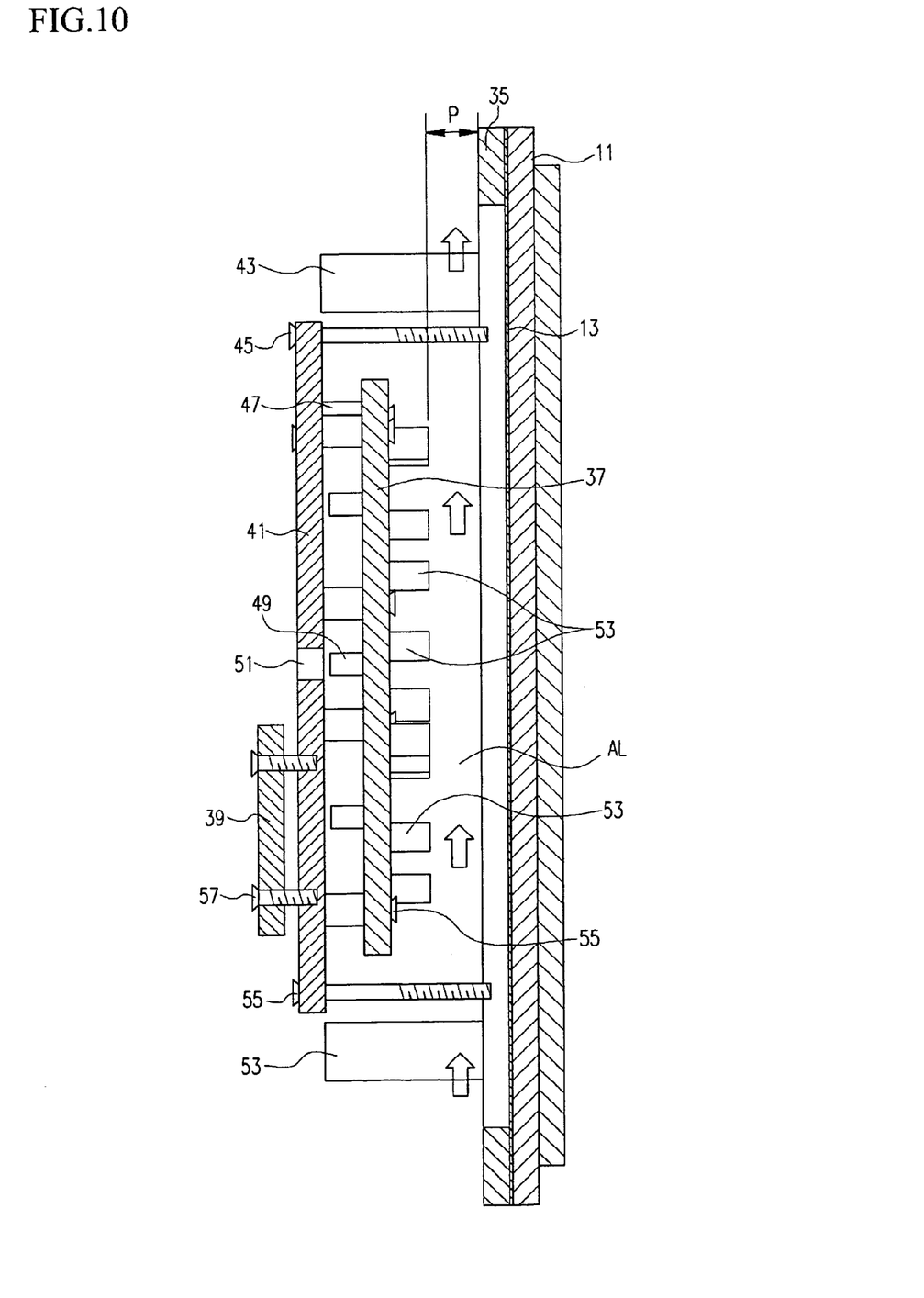
FIG. 10 is a cross-sectional view taken along line B-B of FIG. 6 in a state in which the plasma display apparatus is assembled.

FIG. 10 is a cross-sectional view taken along line B-B of FIG. 6 in a state in which the plasma display apparatus is assembled.

Referring to FIG. 10, it is preferable that the front ends of the elements 53, provided in the driving circuit boards 37 fitted to the boss plate 41, and the rear surface of the plasma display panel 11 or the thermally conductive member 13 provided therein maintain a gap P ranging from 5 mm to 20 mm therebetween. When the gap P is less than 5 mm, the air flow between the thermally conductive member 13 and the elements 53 of the driving circuit boards 37 is suppressed. When the gap P is more than 20 mm, the convection is insufficient due to weakening of the air flow, thereby deteriorating the heat dissipating performance.

The gap P forms an air passage as an air layer AL between the driving circuit boards 37 and the plasma display panel 11. The air layer AL smoothes the air flow among the boss plate 41, the driving circuit boards 37, and the plasma display panel 11, thereby inducing a natural convection phenomenon in addition to a radiation phenomenon. As a result, the heat dissipating efficiency of the plasma display panel 11 and the driving circuit boards 37 can be maximized, even in a structure having a small thickness.

That is, the thermally conductive member 13 is positioned at the side of the air layer AL close to the plasma display panel 11, and the driving circuit boards 37 are positioned at the side of the air layer AL close to the boss plate 41. Therefore, the convection phenomenon and the radiation phenomenon occur due to the air layer AL, thereby effectively dissipating heat from the plasma display panel 11 and the driving circuit boards 37.

Since the elements 53 of the driving circuit boards 37 protrude toward the air layer AL, the noise and EMI generated from the elements 53 are intercepted by the driving circuit boards 37. Therefore, the total performance of intercepting the noise and the EMI in the plasma display apparatus is improved.

FIG. 11 is a perspective view of a boss plate of a plasma display apparatus according to a third embodiment of the present invention.

As shown in FIG. 11, when the boss plate 61 is bent, the fitting of the set circuit boards 39, manufactured by the set makers, to the boss plate 61 can be easily carried out, and mechanical interference between the boss plate 61 and the set circuit boards 39 can be prevented, and the plasma display apparatus can be made with a thickness which is further reduced.

Although exemplary embodiments of the present invention have been described, the present invention is not limited to the exemplary embodiments, but may be modified in various ways without departing from the scope of the appended claims. Therefore, it is natural that such modifications fall within the scope of the present invention.

Furthermore, although preferred embodiments of the present invention have been described, it will be understood by those skilled in the art that the present invention should not be limited to the described preferred embodiments. Rather, various changes and modifications can be made within the spirit and scope of the present invention, as defined by the following claims.

What is claimed is:

1. A plasma display apparatus, comprising:
   a plasma display panel;
   a frame to which the plasma display panel is attached, and by which the plasma display panel is supported; and
   a boss plate fixed to a rear surface of the frame and fitted with driving circuit boards,
   wherein the frame is located between the plasma display panel and the boss plate.

2. The plasma display apparatus of claim 1, wherein the frame is made of metal so as to compensate for rigidity of the plasma display panel, and so as to support an entire weight of the plasma display apparatus.

3. The plasma display apparatus of claim 1, wherein the frame is formed in a shape of a rectangular frame which contacts edges of the plasma display panel.

4. The plasma display apparatus of claim 3, wherein the frame includes a vertical member disposed vertically in the rectangular frame.

5. The plasma display apparatus of claim 3, wherein the frame includes a plurality of bar-shaped members connected integrally to the frame.

6. The plasma display apparatus of claim 1, wherein the frame comprises wall-mounted bosses.

7. The plasma display apparatus of claim 1, wherein the boss plate is made of a conductive material having a weight less than a weight of the frame.

8. The plasma display apparatus of claim 1, wherein the boss plate is made of one of conductive synthetic resin and a metal plate.

9. The plasma display apparatus of claim 1, wherein the boss plate comprises said frame member, a vertical member and a horizontal member.

10. The plasma display apparatus of claim 9, wherein each of the frame member the vertical member, and the horizontal member comprises a plurality of bosses.

11. The plasma display apparatus of claim 10, wherein the bosses have a height ranging from 5 mm to 15 mm.

12. The plasma display apparatus of claim 1, further comprising a thermally conductive member formed on a rear surface of the plasma display panel.

13. The plasma display apparatus of claim 12, wherein the thermally conductive member comprises a heat spreading sheet and is made of at least one of an acrylic heat-spreading material, a graphite heat-dissipating material, a metal heat-dissipating material, and a carbon nanotube heat-dissipating material 14. The plasma display apparatus of claim 12, wherein the thermally conductive member is made of one of a solid-state heat-dissipating material and a heat dissipating material which is hardened from a liquid state with the lapse of time.

15. The plasma display apparatus of claim 12, wherein an air passage is formed between the thermally conductive member and the driving circuit boards.

16. A plasma display apparatus, comprising:
   a plasma display panel;
   a frame to which the plasma display panel is attached and by which the plasma display panel is supported; and
   a boss plate fixed to a rear surface of the frame and fitted with driving circuit boards;
   wherein the boss plate fixes and supports the driving circuit boards at a side opposing the plasma display panel,
   wherein the frame is located between the plasma display panel and the boss plate.

17. The plasma display apparatus of claim 16, wherein the boss plate includes a plurality of bosses for fitting the driving circuit boards, and wherein the boss plate is formed in one of a plate shape and a shape obtained by bending a plate shape.

18. The plasma display apparatus of claim 16, wherein the boss plate includes manipulation holes for manipulating variable elements fitted to the driving circuit boards.

19. The plasma display apparatus of claim 16, wherein the driving circuit boards have elements which are fitted thereto, and which are directed toward the plasma display panel.

20. The plasma display apparatus of claim 19, wherein a gap between the elements and the plasma display panel ranges from 5 mm to 20 mm.

21. The plasma display apparatus of claim 16, wherein the driving circuit boards have variable elements which are fitted thereto, and which are directed toward the boss plate.

22. The plasma display apparatus of claim 16, wherein an air layer for convection and radiation is formed between the driving circuit boards and the plasma display panel.

* * * * *